United States Patent [19]

Rose et al.

[11] Patent Number: 4,760,261
[45] Date of Patent: Jul. 26, 1988

[54] ALPHA-TYPE ELECTRON ENERGY FILTER

[75] Inventors: Harald Rose, Darmstadt; Stefan Lanio, Rossdorf, both of Fed. Rep. of Germany

[73] Assignee: Carl-Zeiss Stiftung, Heidenheim, Fed. Rep. of Germany

[21] Appl. No.: 907,043

[22] Filed: Sep. 12, 1986

[30] Foreign Application Priority Data

Sep. 13, 1985 [DE] Fed. Rep. of Germany ....... 3532698

[51] Int. Cl.$^4$ .................... H05B 31/26; G21K 1/08
[52] U.S. Cl. .................... 250/396 ML; 313/361.1
[58] Field of Search ............... 250/396 R, 396 ML; 219/121 EB, 121 EM; 313/361.1

[56] References Cited

U.S. PATENT DOCUMENTS

| 4,314,218 | 2/1982 | Tronc | 250/396 ML |
| 4,322,622 | 3/1982 | Tronc | 250/396 ML |

FOREIGN PATENT DOCUMENTS 2058485  5/1971  France .......... 250/396 ML

*Primary Examiner*—Bruce C. Anderson
*Attorney, Agent, or Firm*—Walter Ottesen

[57] ABSTRACT

An image forming alpha filter having pole pieces with straight edges is disclosed which has good local resolution and very good energy resolution. It includes three deflection regions, which are separated from one another by relatively large interspaces.

8 Claims, 2 Drawing Sheets

ALPHA-TYPE ELECTRON ENERGY FILTER

FIELD OF THE INVENTION

The invention relates to an imaging magnetic electron energy filter of the alpha type, preferably for electron microscopes, with deflection regions in magnetic fields. One of the deflection regions is traversed upon entry into the energy filter and upon exit therefrom.

BACKGROUND OF THE INVENTION

Imaging electron energy filters, also known as electron filters, energy filters, or electron energy spectrometers are used in transmission electron microscopes to improve the contrast of the image of the specimen by selecting electrons of a particular energy range. This is most clearly apparent with non-contrasting, very thin specimens having a selected energy loss ($\Delta E$) in the range of from approximately 100 to 200 eV. However, even an image of a specimen produced with purely elastically scattered electrons (energy loss $\Delta E=0$), which is done by filtering out any non-elastically scattered electrons ($\Delta E>0$), is markedly improved in contrast as compared with the unfiltered image.

A further substantial advantage of a transmission electron microscope having an imaging electron filter is that element-specific images (that is, element distribution images) can be made simultaneously over a relatively wide specimen range in that the energy range allowed to pass through the electron filter corresponds to an element-specific interaction of the transmitted electrons with the specimen, or in other words corresponds to a K, L or M absorption in the shell of the atom. Thus, it is possible to obtain qualitative distribution images, and quantitative distribution images as well if the intensity ratios are measured and the background is subtracted, of the elements in thin specimens ($\cong 30$ nm) that have very high local resolution ($\cong 0.5$ nm) and maximum detection sensitivity ($\cong 2.10^{-g}$); until now, this was unattainable by any other analysis technology. Maximum local resolution and maximum sensitivity of detection of elements are highly important both in biological and medical research and in the study of materials.

In electron diffraction diagrams, as well, an imaging electron filter produces sharper images of the diffraction diagram by filtering out non-elastically scattered electrons. It is also possible to make diffraction diagrams of non-elastically scattered electrons in a particular energy range.

German Pat. No. 20 28 357 discloses an electron microscope which enables filtering of the image of the specimen or of the image of the diffraction diagram. An electron filter of the so-called Castaing type, comprising a magnetic prism and an electrostatic mirror, is used. The electrostatic mirror, however, is highly sensitive to external stray fields; moreover, at high diffraction voltages for the electrons, problems of insulation also arise. For this reason, purely magnetic filters have been preferred lately. These energy filters are classified as so-called alpha and omega filters in accordance with the course of the electron paths.

An alpha filter is known from a publication by J. P. Perez et al in Journal de Physique, colloquium C2, supplement to n 2, Volume 45, C2-171 (1984). It comprises two magnetic sectors (deflection regions) having different field intensities, which are separated by a narrow interspace, one of the sectors being traversed upon entry into the filter and upon exit therefrom.

To be optimally usable in an electron microscope, an imaging electron filter must meet the following two conditions: first, a large number of image points must be transmitted without loss of local resolution; and second, the imaging errors in the exit source plane (also called a selection plane) must be so slight that narrow energy widths (on the part of the transmitted electrons) can be realized. The known alpha filter does not meet this second condition;

SUMMARY OF THE INVENTION

It is the object of the invention to provide an alpha filter which not only provides good local resolution but also permits narrow energy widths to be realized.

This object is attained in accordance with a feature of the invention by providing three deflection regions, which are separated one from the other by interspaces the length of which is on the order of magnitude of the deflection regions.

In an advantageous embodiment, the deflection angles are in the following ranges:

$$50° \leq \phi_1 \leq 75°$$

$$105° \leq \phi\text{hd } 2130°$$

and the ratio of the deflection radii is in the following range:

$$0.8 \leq R_2/R_1 \leq 1.6.$$

Advantageous ranges for the angles between the pole piece edges and the wave fronts of the electron beam are as follows:

$$-5° \leq \epsilon_1 \leq 15°$$

$$-5° \leq \epsilon_2 \leq 20$$

$$20° \leq \epsilon_3 \leq 40°$$

$$-35° \leq \epsilon_4 \leq -15°$$

In a particularly advantageous embodiment, the peripheral fields that develop outside the edges of the pole pieces are substantially reduced by means of shielding plates (in the literature, these are sometimes referred to as mirror plates or field clamps). These shielding plates are disposed at least at the locations where the electron beam enters the deflection regions and leaves the deflection regions, the shielding plates being spaced by a slight distance from the pole piece edges and preferably at the same elevation as the surfaces of the pole pieces.

In a further advantageous embodiment, the shielding plates and the pole pieces form one part, made for instance from soft iron, with the coils for generating the magnetic field being embedded in a continuous channel which separates the pole piece surfaces from the surrounding shielding surfaces. This technology for producing homogeneous magnetic fields with small, defined peripheral fields is known from a work by A. V. Crewe et al in the Review of Scientific Instruments, Volume 42, page 411 (1971).

In the central plane of the energy filter according to the invention, there is an astigmatic intermediate image of the entry image plane with a line focus parallel to the deflection field direction and an astigmatic intermediate image of the entry source plane with a line focus at right angles to the direction of the deflection field. Moreover, an achromatic and stigmatic image of the entry image plane is projected into the exit image plane on a scale of 1:1, and a dispersive and stigmatic image of the entry source plane is projected into the exit source plane.

A substantial advantage of energy filters having shielding plates is that they are easy to adjust, and that good shielding from stray fields is provided.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
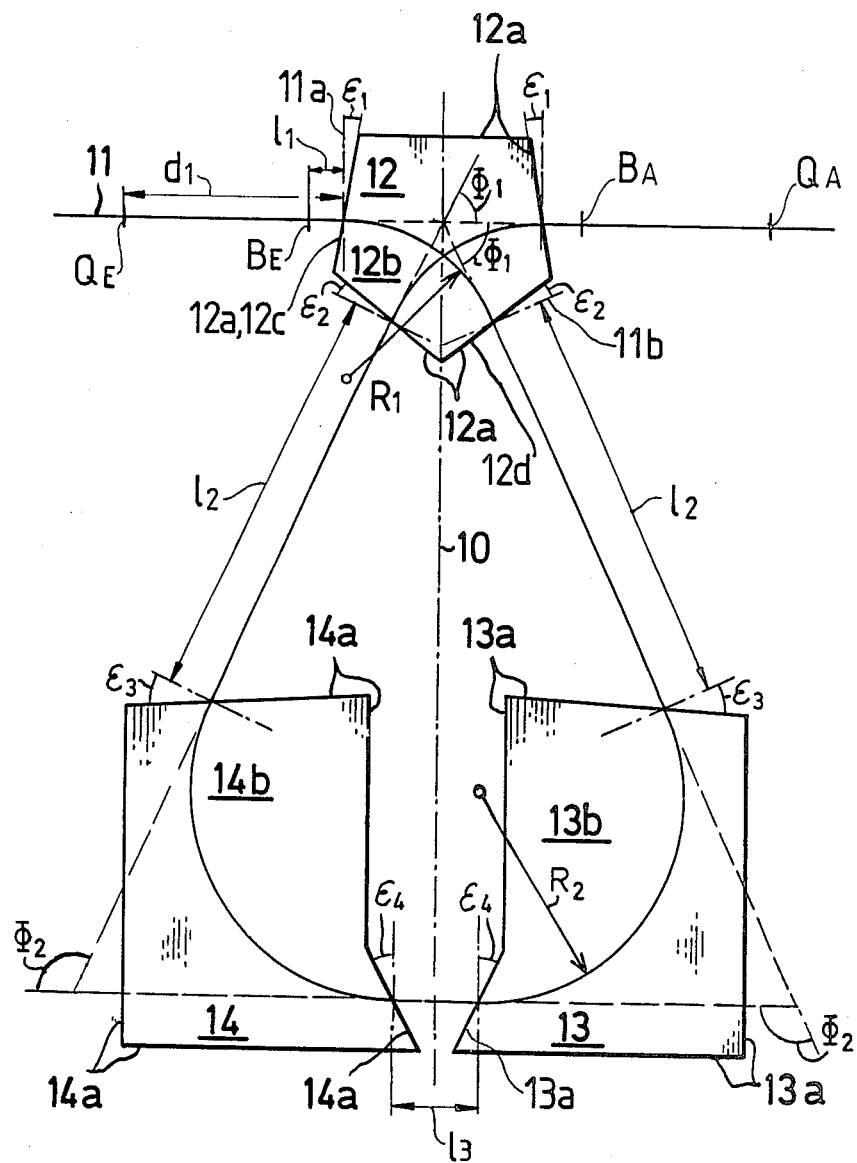
FIG. 1 shows the configuration of an alpha filter according to the invention.

In FIG. 1, the plane of the drawing is the plane in which the center axis 11 of the electron beam passes through the filter. The alpha filter according to the invention is also symmetrical with respect to the center plane, which is at right angles to the plane of the drawing and intersects the same in the line 10.

The filter shown in FIG. 1 comprises magnets, of which the pole pieces 12, 13 and 14, located below the plane of the drawing, are shown along with their edges 12a, 13a and 14a. The pole pieces located below the plane of the drawing and those located thereabove are configured to be mirror symmetrical with respect to the plane of the drawing. There are homogeneous magnetic fields between the mutually adjacent pole pieces, which deflect the electron beam by the angles $\phi_1$ and $\phi_2$ in the deflection regions 12b, 13b and 14b onto circular paths having the deflection radii $R_1$ and $R_2$. The exact radii and angles are a function of the energy of the electrons, so that an energy spectrum from which some ranges can be masked out is created in the exit source plane $Q_A$.

Upon the entry of the electron beam 11 into the first deflection region 12b, the edge 12c of the pole piece 12 (and correspondingly, the edge, not shown, of the second pole piece for the magnetic field, which is mirror symmetrical with respect to the plane of the drawing) forms the angle $\epsilon_1$ with the direction 11a of the wave front of the electron beam 11. The angle $\epsilon_2$ is formed between the direction 11b of the wave front of the electron beam 11 emerging from the deflection region 12b and the edge 12d of the pole piece 12. Corresponding angles $\epsilon_3$ and $\epsilon_4$ are formed upon entry into and exit from the second deflection region 13b. Between the deflection regions 12b, 13b, 14b there are relatively long distances $l_2$ and $l_3$.

Because of the symmetrical configuration of the filter, the angles $\phi_1$, $\phi_2$, $\phi_3$ and $\phi_4$, as shown in FIG. 1, also apply to the entry into and exit from the deflection regions 14b and 12b upon the further passage therethrough. By suitable selection of these angles conjointly defined by the wave fronts and the pole piece edges, focusing of the electron beam even into the plane at right angles to the plane of the drawing can be attained. For good correction of imaging error, the following ranges have been found to be advantageous:

$50° \leq \phi_1 \leq 75°$ $105° \leq \phi_2 130°$ $-5° \leq \epsilon_1 \leq 15°$ $-5° \leq \epsilon_2 20°$ $20° \leq \epsilon_3 \leq 40°$ $-35° \leq \epsilon_4 \leq -15°$ $0.8 \leq R_2/R_1 \leq 1.6$ The remaining geometrical dimensions of the energy filter $d_1$, $l_1$, $l_2$, $l_3$ and $R_2/R_1$ are necessarily obtained from the requirement for an at least approximately stigmatic image of the entry image plane $B_E$ into the exit image plane $B_A$ and of the entry source plane $Q_E$ into the exit source plane $Q_A$.

Figure 2A:
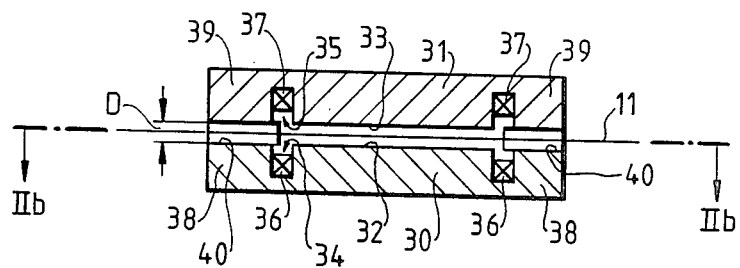
FIG. 2a is a section taken through a deflector system comprising two pole pieces with integrated shielding plates; and, FIG. 2b is a plan view taken along line IIb—IIb of FIG. 2a of a pole piece having integrated shielding plates.
Figure 2B:
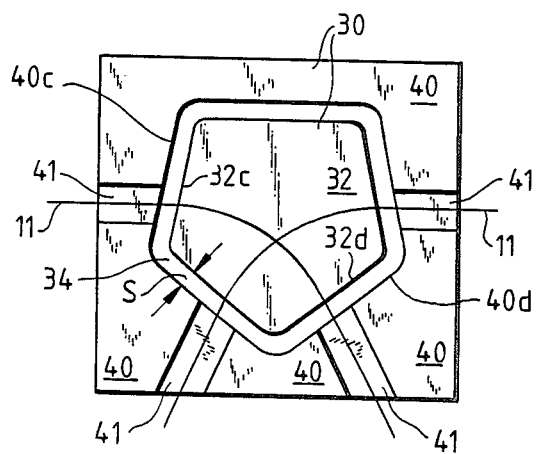

The pole pieces 12, 13 and 14 shown in FIG. 1 have very extensive peripheral fields, which influence the electron beam 11 even outside the deflection regions 12b, 13b and 14b. These peripheral fields can be reduced substantially by means of shielding plates. A particularly advantageous embodiment of this is shown in FIGS. 2a and 2b, in which the pole piece, which is equivalent to the pole piece 12 of FIG. 1, forms one integral part 30 together with the shielding plates. The part 30, like the second part 31 belonging to the deflector system, may for instance be made of soft iron. Grooves 34 and 35 having the width S are machined into the respective parts 30 and 31 and their inner contour defines the shape of the respective pole pieces 32 and 33, for instance having the edges 32c and 32d. The outer contour of the grooves 34 and 35 forms the edges 40c and 40d, for example, of the shielding plate 38. A current flowing through the coils 36 and 37 located in the grooves 34 and 35 generates a homogeneous magnetic field between the pole pieces 32 and 33. In contrast, there is no magnetic field produced outside the grooves 34 and 35, so that the peripheral field is substantially limited to the width S of the grooves. In a suitable manner, the spacing D between the shielding plates 38 and 39, at the locations 41 through which the electron beam 11 passes, is of the same size as the spacing between the pole piece surfaces 32 and 33. This does not necessarily have to be the case, however. At the other locations 40, the shielding plates 38 and 39 are located immediately adjacent one another.

The greatest number of image points which are transmitted without any loss of local resolution, and the least errors in the exit source plane $Q_A$, so that the lowest energy widths are attainable, are attained with the following values:

$\phi_1 = 65°$ $\phi_2 = 115°$ $\epsilon_1 = 9.5°$ $\epsilon_2 = 13.7°$ $\epsilon_3 = 29.4°$ $\epsilon_4 = -27.5°$ $R_2/R_1 = 1.2$ and with the following geometrical dimensions:

$d_1 = 1.73 \, R_1$ $l_1 = 0.28 \, R_1$ $l_2 = 2.41 \, R_1$ $l_3 = 0.50 \, R_1$ $S = 0.10 \, R_1$ $D = 0.10 \, R_1$

The above geometrical dimensions of the filter are standardized in such a way that by suitable selection of $R_1$, the difference of the distances $d_1 - l_1$ can be adapted to the distance between the source plane and the image plane, which is predetermined by the imaging system of whichever electron microscope is used.

In comparison with the energy filter of the prior art described herein, a filter having the above-indicated values has a local resolution which is poorer by a factor of less than 2, but in compensation therefor, the filter according to the invention has an energy resolution that is better by a factor of more than 200. In typical electron microscopes having a final image radius of 50 mm, energy widths $\Delta E$ of up to 2.6 eV are thereby attainable.

It is understood that the foregoing description is that of the preferred embodiments of the invention and that various changes and modifications may be made thereto without departing from the spirit and scope of the invention as defined in the appended claims.

What is claimed is:

1. An imaging magnetic electron-energy alpha filter for an apparatus such as an electron microscope in which an electron beam is generated and transmitted along a straight-line path in a predetermined direction, the filter comprising:

three pole-piece units for generating three magnetic fields thereby defining three deflection regions for deflecting said beam as the latter passes therethrough and said deflection regions each having a predetermined length;

a first one of said pole-piece units being arranged for receiving said beam as it enters said filter to deflect said beam through a first angle and out of said beam path;

a second one said pole-piece units being spaced from said first pole-piece unit by a first interspace for receiving said beam from said first one of said pole-piece units to deflect said beam through a second angle;

a third one of said pole-piece units being spaced from both said first pole-piece unit and said second pole-piece unit by a second interspace and a third interspace, respectively, for receiving said beam from said second one of said pole-piece units to deflect said beam through a third angle toward said first one of said pole-piece units;

said first one of said pole-piece units being arranged to receive said beam from said third one of said pole-piece units for deflecting said beam through a fourth angle so as to return said beam to said beam path to continue in said direction; and, said interspaces having respective lengths in the order of magnitude of said predetermined lengths of said deflection regions.

2. An imaging magnetic electron-energy filter of the alpha type for an apparatus such as an electron microscope in which an electron beam is generated, the filter comprising:

three pole-piece units for generating three magnetic fields thereby defining three deflection regions for deflecting said beam as the latter passes therethrough and said deflection regions each having a predetermined length;

a first one of said pole-piece units being arranged for receiving said beam as it enters said filter and for again receiving said beam just before it leaves said filter;

a second one of said pole-piece units being spaced from said first pole-piece unit by a first interspace; and, a third one of said pole-piece units being spaced from both said first pole-piece unit and said second pole-piece unit by a second interspace and a third interspace, respectively;

said interspaces having respective lengths in the order of magnitude of said predetermined lengths of said reflection regions; and, said first pole-piece unit generating a magnetic field for deflecting said electron beam through a first curve having a deflection radius $R_1$ corresponding to a first deflection angle $\phi_1$ as it passes into and again when it exists from said filter; said second pole-piece unit and said third pole-piece unit each generating a magnetic field for deflecting said electron beam through a second curve having a deflection radius $R_2$ corresponding to a second deflection angle $\phi_2$ as it passes therethrough; said deflection angles $\phi_1$ and $\phi_2$ lying in the respective value ranges of:

$50° \leq \phi_1 \leq 75°$ $105° \leq \phi_2 \leq 130°$ and said deflection radii $R_1$ and $R_2$ having a ratio of $R_2/R_1$ in the value range $0.8 \leq R_2/R_1 \leq 1.6$.

3. The filter of claim 2, wherein the filter defines an entry source plane ($Q_E$), an entry image plane ($B_E$), an exit image plane ($B_A$) and an exit source plane ($Q_A$); said three pole-piece units being arranged so as to act on said electron beam successively along the beam path through the filter, said pole-piece units each defining respective edges disposed transversely to said beam where said beam enters and exits from the magnetic field thereof;

the edges of said first pole-piece unit through which said beam passes being four in number and the wave front of said beam conjointly defining respective angles $\epsilon_1$ and $\epsilon_2$ with the first two of said edges as said beam passes into said filter and into and from the magnetic field of said first pole-piece unit;

the edges of said second pole-piece unit and the wave front of said beam conjointly defining respective angles $\epsilon_3$ and $\epsilon_4$ as said beam passes into and from the magnetic field thereof;

the edges of said third pole-piece unit and the wave front of said beam defining respective angles $\epsilon_4$ and $\epsilon_3$ as said beam passes into and from the magnetic field thereof;

the second two edges of said first pole-piece unit and the wave front of said beam conjointly defining respective angles $\epsilon_2$ and $\epsilon_1$ as said beam passes into and from the magnetic field of said first pole-piece unit and out of said filter;

said entry source plane ($Q_E$) being spaced from the first entry edge of said first pole-piece unit by a dimension ($d_1$); the first entry edge of said first pole-piece unit being spaced a distance ($l_1$) from said entry image plane ($B_E$); the first exit edge of said first pole-piece unit being spaced from the entry edge of said second pole-piece unit by said first interspace corresponding to a dimension ($l_2$); the exit edge of said second pole-piece unit being spaced from the entry edge of said third pole-piece unit by said second interspace corresponding to a dimension ($l_3$); the exit edge of said third pole-piece unit being spaced from the second entry edge of said first pole-piece unit by said third interspace also corresponding to the dimension ($l_2$);

said angles ($\epsilon_1$, $\epsilon_2$, $\epsilon_3$ and $\epsilon_4$) having values in the following ranges:

$$-5° \leq \epsilon_1 \leq 15°$$

$$-5° \leq \epsilon_2 \leq 20°$$

$$20° \leq \epsilon_3 \leq 40°$$

$$-35° \leq \epsilon_4 \leq -15$$

and said dimensions ($d_1$, $l_1$, $l_2$, $l_3$) and said ratio ($R_2/R_1$) being selected so as to cause at least an approximate stigmatic imaging of said entry image plane ($B_E$) into said exit image plane ($B_A$) and so as to cause at least an approximate stigmatic imaging of said entry source plane ($Q_E$) into said exit image plane ($Q_A$).

4. The filter of claim 3, wherein each of said pole-piece units including two mutually adjacent pole pieces having respective pole faces facing each other and having respective peripheral edges; said filter further comprising shielding plate means for suppressing peripheral fields lying outside of said deflection regions, said shielding plate means being arranged ahead of the first one of said deflection regions where said electron beam enters said filter and after the first one of said deflection regions where said electron beam passes from said filter as well as between each two mutually adjacent ones of said deflection regions; said shielding plate means having a surface at least approximately at the elevation of said pole faces and a peripheral edge at a narrow spacing (S) parallel to the peripheral edges of said pole pieces.

5. The filter of claim 4, said shielding plate means defining a spacing (D) at which said beam passes through said filter; said angles ($\phi_1$, $\phi_2$, $\epsilon_1$, $\epsilon_2$, $\epsilon_3$, $\epsilon_4$) having the following values:

$$\phi_1 = 65°$$

$$\phi_2 = 115°$$

$$\epsilon_1 = 9.5°$$

$$\epsilon_2 = 13.7°$$

$$\epsilon_3 = 29.4°$$

$$\epsilon_4 = -27.5°$$

with said ratio $R_2/R_1 = 1.2$, and said dimensions ($d_1$, $l_1$, $l_2$, $l_3$, S, D) having the following values:

$$d_1 = 1.73 R_1$$

$$l_1 = 0.28 R_1$$

$$l_2 = 2.41 R_1$$

$$l_3 = 0.50 R_1$$

$$S = 0.10 R_1$$

$$D = 0.10 R_1$$

said radius ($R_1$) being selected so that the difference of ($d_1 - l_1$) is equal to the spacing between said entry source plane ($Q_E$) and said entry image plane ($B_E$) as required by the imaging system of said electron microscope.

6. The filter of claim 3, wherein said filter is symmetrical with respect to a center plane passing through and bisecting said first pole-piece unit and being midway between said second pole-piece unit and said third pole-piece unit; said magnetic fields generated by said pole-piece units each being a deflection field for deflecting said electron beam through a corresponding one of said deflection angles, said deflection fields having a predetermined direction; said filter being configured so as to cause an astigmatic intermediate image of said entry image plane ($B_E$) having a line focus parallel to said predetermined direction and an astigmatic intermediate image of said entry source plane ($Q_E$) having a line focus perpendicular to said predetermined direction to lie in said center plane.

7. The filter of claim 1, wherein said first and fourth angles are equal to each other.

8. The filter of claim 7, wherein said second and third angles are equal to each other.

* * * * *

UNITED STATES PATENT AND TRADEMARK OFFICE
CERTIFICATE OF CORRECTION

PATENT NO. : 4,760,261

DATED : July 26, 1988

INVENTOR(S) : Harald Rose and Stefan Lanio

It is certified that error appears in the above-identified patent and that said Letters Patent is hereby corrected as shown below:

In column 1, line 38: delete "($\cong$30" and substitute -- ($\leq$30 -- therefor.

In column 1, line 40: delete "($\cong$2.10$^-$g);" and substitute -- ($\cong$2.10$^{-21}$g); -- therefor.

In column 2, line 11: after "condition;" add -- its smallest energy width is approximately 700 eV. --

In column 2, line 27: delete "105°$\leq$ $\phi$hd 2130°" and substitute -- 105° $\leq$ $\phi_2$ $\leq$ 130° -- therefor.

In column 3, line 60: delete "$\phi_1$, $\phi_2$, $\phi_3$ and $\phi_4$," and substitute -- $\epsilon_1$, $\epsilon_2$, $\epsilon_3$ and $\epsilon_4$, -- therefor.

In column 4, line 3: delete "105°$\leq$$\phi_2$130°" and substitute -- 105° < $\phi_2$ $\leq$130° -- therefor.

In column 4, line 7: delete "-5°$\leq$ $\epsilon_2$20°" and substitute -- -5° $\leq$ $\epsilon_2$ $\leq$ 20° -- therefor.

In column 5, line 51: between "one" and "said", insert -- of --

UNITED STATES PATENT AND TRADEMARK OFFICE
CERTIFICATE OF CORRECTION

PATENT NO. : 4,760,261

DATED : July 26, 1988

INVENTOR(S) : Harald Rose and Stefan Lanio

It is certified that error appears in the above-identified patent and that said Letters Patent is hereby corrected as shown below:

In column 6, line 26: delete "reflection" and substitute -- deflection -- therefor.

In column 7, line 29: delete "-15" and substitute -- $-15°$ -- therefor.

In column 8, line 12: delete "$\varepsilon_3 32\ 29.4°$" and substitute -- $\varepsilon_3 = 29.4°$ -- therefor.

Signed and Sealed this

Fifth Day of September, 1989

Attest:

DONALD J. QUIGG

Attesting Officer

Commissioner of Patents and Trademarks